United States Patent
Liu et al.

(10) Patent No.: US 8,503,227 B2
(45) Date of Patent: *Aug. 6, 2013

(54) TRANSIENT HEAT ASSISTED STTRAM CELL FOR LOWER PROGRAMMING CURRENT

(75) Inventors: Jun Liu, Boise, ID (US); Gurtej Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 13/568,937

(22) Filed: Aug. 7, 2012

(65) Prior Publication Data

US 2012/0300540 A1    Nov. 29, 2012

Related U.S. Application Data

(63) Continuation of application No. 12/642,533, filed on Dec. 18, 2009, now Pat. No. 8,238,151.

(51) Int. Cl.
*G11C 11/14* (2006.01)
(52) U.S. Cl.
USPC ............................................ 365/171; 365/158
(58) Field of Classification Search
USPC .................................................. 365/171, 158
See application file for complete search history.

(56) References Cited

U.S. PATENT DOCUMENTS

| | | | |
|---|---|---|---|
| 7,310,265 B2 | 12/2007 | Zheng et al. | |
| 7,372,722 B2* | 5/2008 | Jeong et al. | 365/158 |
| 7,443,718 B2 | 10/2008 | Ito et al. | |
| 8,102,700 B2 | 1/2012 | Liu et al. | |
| 2005/0128801 A1* | 6/2005 | Nickel et al. | 365/171 |
| 2008/0197433 A1 | 8/2008 | Higo et al. | |
| 2009/0016096 A1 | 1/2009 | Leuschner | |
| 2009/0050991 A1 | 2/2009 | Nagai et al. | |
| 2009/0147392 A1 | 6/2009 | Prejbeanu | |

\* cited by examiner

*Primary Examiner* — Michael Tran
(74) *Attorney, Agent, or Firm* — Fletcher Yoder

(57) ABSTRACT

A memory cell including magnetic materials and heating materials, and methods of programming the memory cell are provided. The memory cell includes a free region, a pinned region, and a heating region configured to generate and transfer heat to the free region when a programming current is directed to the cell. The heat transferred from the heating region increases the temperature of the free region, which decreases the magnetization and the critical switching current density of the free region. In some embodiments, the heating region may also provide a current path to the free region, and the magnetization of the free region may be switched according to the spin polarity of the programming current, programming the memory cell to a high resistance state or a low resistance state.

25 Claims, 5 Drawing Sheets

TRANSIENT HEAT ASSISTED STTRAM CELL FOR LOWER PROGRAMMING CURRENT

CROSS-REFERENCE TO RELATED APPLICATION

This application is a continuation of U.S. patent application Ser. No. 12/642,533, which was filed on Dec. 18, 2009, now U.S. Pat. No. 8,238,151, which issued on Aug. 7, 2012.

BACKGROUND

1. Field of Invention

Embodiments of the invention relate generally to magnetic random access memory, and more particularly, to Spin Torque Transfer Magnetic Random Access Memory (STT-MRAM).

2. Description of Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light and not as admissions of prior art.

Magnetic Random Access Memory (MRAM) is a non-volatile computer memory technology based on magnetoresistance. MRAM differs from volatile Random Access Memory (RAM) in several respects. Because MRAM is non-volatile, MRAM can maintain memory content when the memory device is not powered. Though non-volatile RAM is typically slower than volatile RAM, MRAM has read and write response times that are comparable to that of volatile RAM. Unlike typical RAM technologies which store data as electric charge, MRAM data is stored by magnetoresistive elements. Generally, the magnetoresistive elements in an MRAM cell are made from two magnetic regions, each of which holds a magnetization. The magnetization of one region (the "pinned region") is fixed in its magnetic orientation, and the magnetization of the other region (the "free region") can be changed by an external magnetic field generated by a programming current. Thus, the magnetic field of the programming current can cause the magnetic orientations of the two magnetic regions to be either parallel, giving a lower electrical resistance across the magnetoresistive elements ("0" state), or antiparallel, giving a higher electrical resistance across the magnetoresistive elements ("1" state) of the MRAM cell. The switching of the magnetic orientation of the free region and the resulting high or low resistance states across the magnetoresistive elements provide for the write and read operations of the typical MRAM cell.

Though MRAM technology offers non-volatility and faster response times, the MRAM cell is limited in scalability and susceptible to write disturbances. The programming current employed to switch between high and low resistance states across the MRAM magnetic regions is typically high. Thus, when multiple cells are arranged in an MRAM array, the programming current directed to one memory cell may induce a field change in the free region of an adjacent cell. This potential for writes disturbances, also known as the "half-select problem," can be addressed using a spin torque transfer technique.

A conventional spin torque transfer MRAM (STT-MRAM) cell may include a magnetic cell stack, which may be a magnetic tunnel junction (MTJ) or a spin valve structure. An MTJ is a magnetoresistive data storing element including two magnetic regions (one pinned and one free) and nonmagnetic region in between, which may be accessed through data lines (e.g., bit line, word line, source line, etc.) and an access transistor. A spin valve has a structure similar to the MTJ, except a spin valve has a conductive region in between the two magnetic regions.

A programming current typically flows through the access transistor and the magnetic cell stack. The pinned region polarizes the electron spin of the programming current, and torque is created as the spin-polarized current passes through the stack. The spin-polarized electron current interacts with the free region by exerting a torque on the free region. When the torque of the spin-polarized electron current passing through the stack is greater than the critical switching current density ($J_c$), the torque exerted by the spin-polarized electron current is sufficient to switch the magnetization of the free region. Thus, the magnetization of the free region can be aligned to be either parallel or antiparallel to the pinned region, and the resistance state across the stack is changed.

The STT-MRAM has advantageous characteristics over the MRAM, because the spin-polarized electron current eliminates the need for an external magnetic field to switch the free region in the magnetoresistive elements. Further, scalability is improved as the programming current decreases with decreasing cell sizes, and the write disturbance and half-select problem is addressed. Additionally, STT-MRAM technology allows for a higher tunnel magnetic resistance ratio, meaning there is a larger ratio between high and low resistance states, which may improve the accuracy of read operations in the magnetic domain.

However, high programming current densities through the STT-MRAM cell may still be problematic. High current densities through the magnetic regions of the memory cell may increase the energy consumption in the cell and the thermal profile in the regions, affecting the cell's integrity and reliability, and may also lead to larger silicon real estate consumption for each cell.

BRIEF DESCRIPTION OF DRAWINGS

Certain embodiments are described in the following detailed description and in reference to the drawings in which.

DETAILED DESCRIPTION

A spin torque transfer magnetic random access memory (STT-MRAM) cell is programmed by changing the resistance of an STT-MRAM structure. The STT-MRAM structure, which may also be referred to as an STT-MRAM cell structure, an STT-MRAM cell, a memory cell, or a magnetic cell structure, may include regions of materials, including magnetic materials which may have a magnetization. During programming, one magnetic region of the STT-MRAM cell, referred to as the "free region," may be switched in magnetization, and another magnetic region, referred to as the "pinned region," may remain fixed in magnetization. Typically, the free region magnetization may be in a direction either parallel or antiparallel to the pinned region magnetization. When the magnetizations of the free and pinned regions are parallel, the resistance across the regions may be low, and when the magnetizations of the free and pinned regions are antiparallel, the resistance may be high. Thus, an STT-MRAM cell may be programmed to either a low or a high resistance state by switching the magnetization of the free region.

In a read operation of the STT-MRAM cell, a current is used to detect the programmed state by measuring the resistance through the cell. To initiate a read operation, a read current may be generated and passed through a bit line and a source line of the cell and through a transistor. The programmed state of the STT-MRAM structure may be determined by the voltage difference between the bit line and the source line. In some embodiments, the voltage difference may be compared to a reference and amplified by a sense amplifier.

During a write operation of an STT-MRAM cell, a programming current is applied to the cell that is selected for programming. To initiate the write operation, a write current may be generated and passed to the bit line and the source line of the memory cell. As the programming current passes the pinned region of the cell, the electrons of the programming current are spin-polarized by the pinned region to exert a torque on the free region, which switches the magnetization of the free region to "write to" or "program" the cell. The polarity of the voltage between the bit line and the source line determines the switch in magnetization of the free region in the cell.

Figure 1:
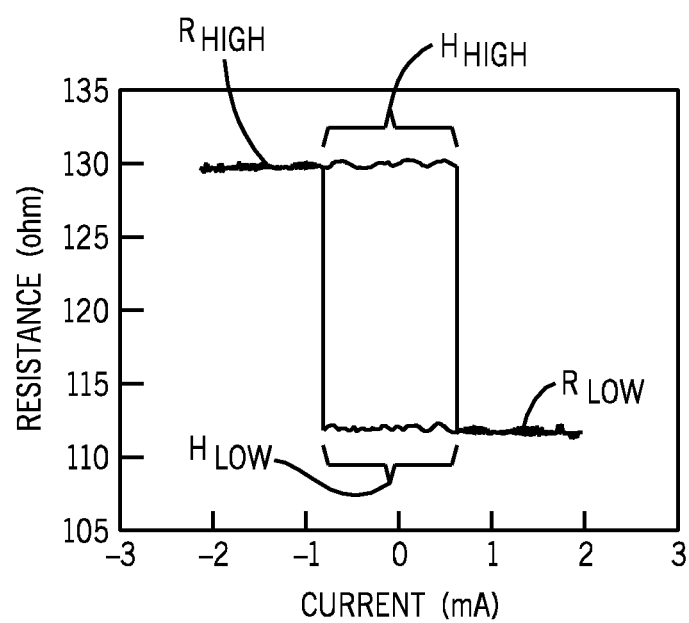
FIG. 1 is a graph illustrating the relationship between programming current direction and the resistance states in an STT-MRAM cell, in accordance with an embodiment of the present technique.

Switching the free region magnetization (and the resistance state of the cell) occurs when the current density passing through the memory cell is larger than the critical switching current density. An example of how the resistance across a magnetic cell structure in an STT-MRAM cell may change based on a programming current is depicted in the graph of FIG. 1. The values used in this graph are examples to illustrate a general relationship between a programming current and STT-MRAM cell resistance states. STT-MRAM cells, in embodiments of the present technique, may be programmed with different current values, and may have various resistance values in different programmed states. In the graph of FIG. 1, the cell is programmed to a high resistance state $R_{HIGH}$ at approximately 130 ohms when the programming current is below −1 mA. The cell is programmed to a low resistance state $R_{LOW}$ at approximately 111 ohms when the programming current is above 1 mA. The negative and positive programming current values may indicate that the programming current is applied in opposite directions through the magnetic cell stack. Programming currents in opposite directions may have electrons with spin polarization directions that switch the free region magnetization in opposite directions (i.e., parallel or antiparallel to the pinned region magnetization).

When the current through the cell is not below −1 mA or not above 1 mA, then the programming current may not be great enough to switch the free region magnetization. More specifically, the current density in the free region may not reach the critical switching current density of the free region. If the programming current does not have a current density in the free region that is sufficient to switch the magnetization, the cell may be at either resistance state, as indicated by hysteresis segments $H_{HIGH}$ and $H_{LOW}$ when the current is between −1 mA and 1 mA.

Thus, to program the cell, the programming current density need only be slightly higher than the critical switching current density. Since passing a larger programming current increases the energy consumption and the thermal profile in the cell stack, which affects the integrity and reliability of the cell, it is desirable to decrease the critical switching current without affecting the cell's thermal stability. Applying a lower programming current while maintaining a programming current density that is above the critical switching current density would allow a smaller current to switch the free region of the cell. The following discussion describes the systems and devices, and the operation of such systems and devices in accordance with the embodiments of the present technique.

The critical switching current density needed to switch the magnetization of a magnetic material may be directly proportional to the magnetization of the material. This relationship may be presented in the following equation:

$$J_c = \frac{2eaM_s I_F(H + H_K + 2\pi M_s)}{\hbar \eta}$$

where $J_c$ represents the critical switching current density, and $M_s$ represents the magnetization of a magnetic material. When magnetization is decreased, the critical switching current density is also decreased.

Figure 2:
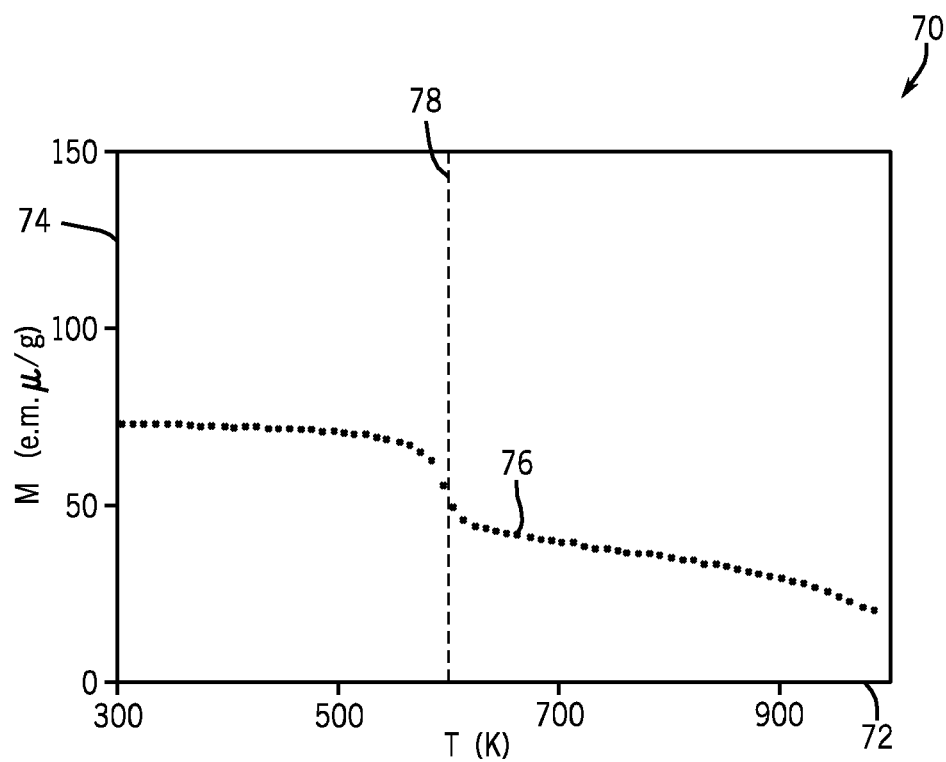
FIG. 2 is a graph illustrating the relationship between temperature and magnetization in magnetic materials, in accordance with embodiments of the present technique.

One method of decreasing the magnetization of the free region to decrease the critical switching current density may be to increase the temperature of the free region. In some embodiments of the present techniques, an STT-MRAM structure may include a heater material, which may generate a transient heat which may reduce the magnetization of the free region. The graph 70 of FIG. 2 plots a relationship (indicated by curve 76) between temperature (in Kelvins) 72 and magnetization (in electromagnetic units per gram) 74 in a magnetic material. As depicted by the shape of the curve 76, the magnetization 74 of a magnetic material may decrease substantially with an increase of temperature 72 towards and past the Curie point (approximately at point 78) of the magnetic material. As the magnetization of a magnetic material decreases, the critical switching current density of the material also decreases. Thus, by reducing the magnetization of the free region, a smaller programming current may be used to switch the direction of magnetization of the free region. Once the free region is magnetized according to the spin polarity of the programming current electrons, the programmed state is written to the STT-MRAM structure.

Figure 3A:
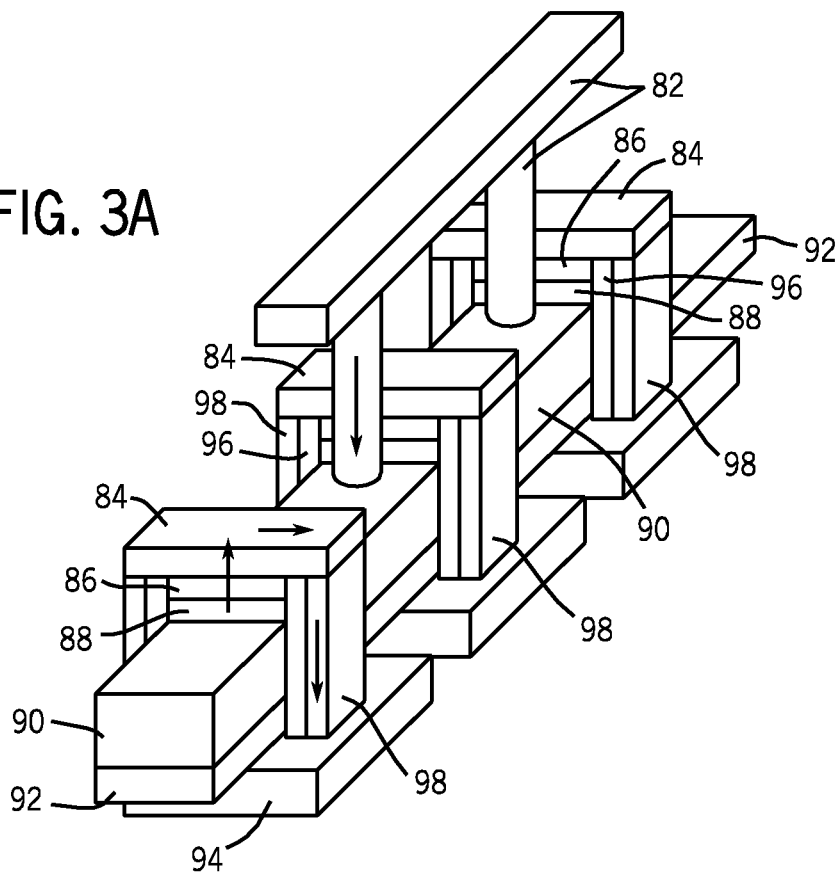
FIGS. 3A and 3B depict an axial view and a three-dimensional view of an STT-MRAM cell configured for heat-assisted programming, in accordance with embodiments of the present technique.
Figure 3B:
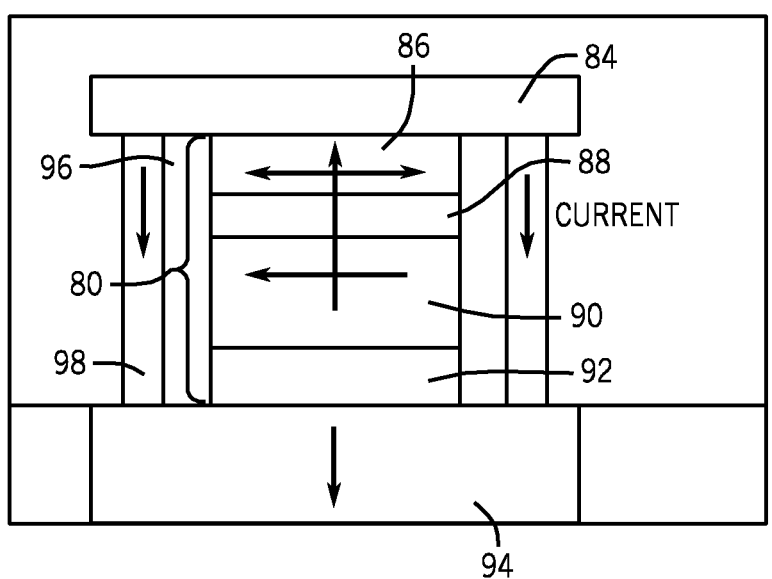

In some embodiments, an STT-MRAM cell may be configured such that heat from a heater material may increase the temperature of a free region in the magnetic cell structure of the STT-MRAM cell, thus decreasing the magnetization (as discussed with respect to FIG. 2) and decreasing the critical switching current density in the free region (as discussed with respect to equation (1)). One embodiment for programming a STT-MRAM cell with a decreased programming current by implementing a heating effect on the free region is illustrated in FIGS. 3A and 3B, which depict a three-dimensional view (FIG. 3A) and an axial cross section (FIG. 3B) of an STT-MRAM cell 80.

In one embodiment, the STT-MRAM cell 80 may include a free region 86 and a pinned region 90 with a nonmagnetic region 88 in between. The pinned region 90 may have a magnetization with a fixed or preferred orientation, which is represented by the arrow indicating that the magnetization of the pinned region 90 is oriented to the left. The free region 86 has a magnetization which may be switched in either a direction parallel or antiparallel to the magnetization of the pinned region 90 (e.g., left or right, respectively), thus changing the resistance across the cell structure 80 and programming the cell to either a high resistance state or a low resistance state. The memory cell structure 80 may also include a heater material 98, which may be employed to decrease the magnetization of the free region 86. Some embodiments may also include an insulative region 92 which may insulate the pinned region 90 from a substrate contact 94 coupled to the magnetic cell structure 80, as well as an electrical insulator 96 which may facilitate in transferring the heat from the heating region 98 to the free layer 86 and/or controlling the temperature of one or more regions of the structure 80.

When an STT-MRAM cell is selected for programming, a programming current may be applied to the selected cell via a data line. For example, each STT-MRAM cell structure in an electronic system may be coupled to a data line 82 which may deliver current to a selected cell for read and/or write operations. The direction of the arrows illustrated in FIGS. 3A and 3B may generally depict a direction of the programming current to and through one embodiment of an STT-MRAM cell selected for programming. The current may be directed from the data line 82 (FIG. 3A) to the pinned region 90 of the selected cell. The current may then flow from the pinned region 90 through the nonmagnetic region 88 and the free region 86 to a top electrode 84 of the selected STT-MRAM cell. The programming current may then flow from the top electrode 84 to the heater material 98, which may result in a transient heating of the heater material 98. The top electrode 84 may also be composed of the same heater material as the heating region 98.

The transient heat produced in the heater material 98 may increase the temperature of the free region 86, which may decrease the magnetization of the free region 86 to facilitate programming the selected STT-MRAM cell with a decreased programming current. The decreased magnetization may proportionately decrease the critical switching current density of the free region 86, or the current density at which the magnetization of the free region 86 may be switched. For example, the critical switching current density for programming a typical STT-MRAM cell may be approximately 1 MA/cm². In accordance with the present techniques, the critical switching current density may be reduced to approximately 0.5 mA/cm².

The heat generated by heating region 98 and transferred to the free region 86 may be transient, and may only affect the free region 86 of a cell selected for programming, and only during programming of the selected cell. The heating region 98 may not transfer a significant amount of heat to the free region 86 once the programming operation is complete. Further, in this and in other embodiments of the present techniques, the magnetization of the pinned region 96 may not be substantially affected, as the pinned region may have a fixed magnetization, a higher curie temperature, and/or a higher magnetization than the free region 86. Thus, a programming current may be sufficiently high to affect the magnetization of the free region 86, but not sufficiently high to affect the magnetization of the pinned region 96.

The materials discussed below are examples of some materials which may be used in embodiments in accordance with the present techniques. In some embodiments, the free region 86 and the pinned region 90 may comprise ferromagnetic materials, such as Co, Fe, Ni or its alloys, NiFe, CoFe, Co-NiFe, or doped alloys CoX, CoFeX, CoNiFeX (X=B, Cu, Re, Ru, Rh, Hf, Pd, Pt, C), or other half-metallic ferromagnetic material such as Fe3O4, CrO2, NiMnSb and PtMnSb, and BiFeO, for instance. The free region 86 and the pinned region 90 may have substantially similar materials, or may have different combinations of the materials listed above. The nonmagnetic region 88 may comprise materials such as Cu, Ag, Ta, Au, CuPt, CuMn, other suitable conductive nonmagnetic materials, any combination of the above materials, or nonconductive materials such as $AC_xO_y$, MgO, AlN, SiN, $CaO_x$, $NiO_x$, $Hf_xO_y$, $Ta_xO_y$, $Zr_xO_y$, $NiMnO_x$, $Mg_xF_y$, SiC, $SiO_2$, $SiO_xN_y$, or any combination of the above materials. The insulative region 92 may comprise materials such as SiN, SiC, or any other suitable dielectric. The insulative region 92 may also comprise chalcogenide material, such as GeSe or GeS, or any combination of the above materials, and may have a thickness of approximately 10 nm to 30 nm.

The heater material may be any material capable of generating heat and transferring heat to the free region 86, and may have relatively high resistivity and be able to withstand high temperatures. The heater material may also be relatively inert, and may not react substantially with surrounding materials. For example, the heater material may include refractory metal nitride, TiN, ZrN, HfN, VN, NbN, TaN, TiAlN, TiSiN, TaSiN, TiCN; carbide, such as TiC, ZrC, HfC, VC, NbC, TaC, $Cr_3C_2$, $Mo_2C$, WC, SiC, $B_4C$; boride, such as $TiB_2$, $ZrB_2$, $HfB_2$, $VB_2$, $NbB_2$, $TaB_2$, $CrB_2$, $Mo_2B_5$, $W_2B_5$, doped silicon, such as $WSi_x$, $MoSi_2$, $SnO_2$:Sb, carbon, niobium, tungsten, molybdenum; metal alloys, such as NiCr, or any combination thereof. The heater material may have a thickness between approximately 5 nm-20 nm in a direction perpendicular to a current path through the heater material. In some embodiments, the heater material 98 may be in direct contact with the cell structure 80, and in other embodiments, the heater material 98 may be separated from the cell structure 80 by the electrical insulator 96. In one embodiment, may include silicon dioxide, silicon nitride, or any other insulative material suitable for electrically insulating and/or transferring heat to the cell structure 80. Further, in some embodiments, a heat insulator 96 that is generally parallel between the heater material 98 and the cell structure 80 may have a perpendicular thickness of approximately 2 nm to 10 nm.

Furthermore, any of the above examples (e.g., programming current ranges, critical switching current density ranges, materials and/or thicknesses of regions in the cell structure) may vary, based on different configurations of the STT-MRAM cells or of the STT-MRAM cell configuration within an electronic system.

Figure 4:
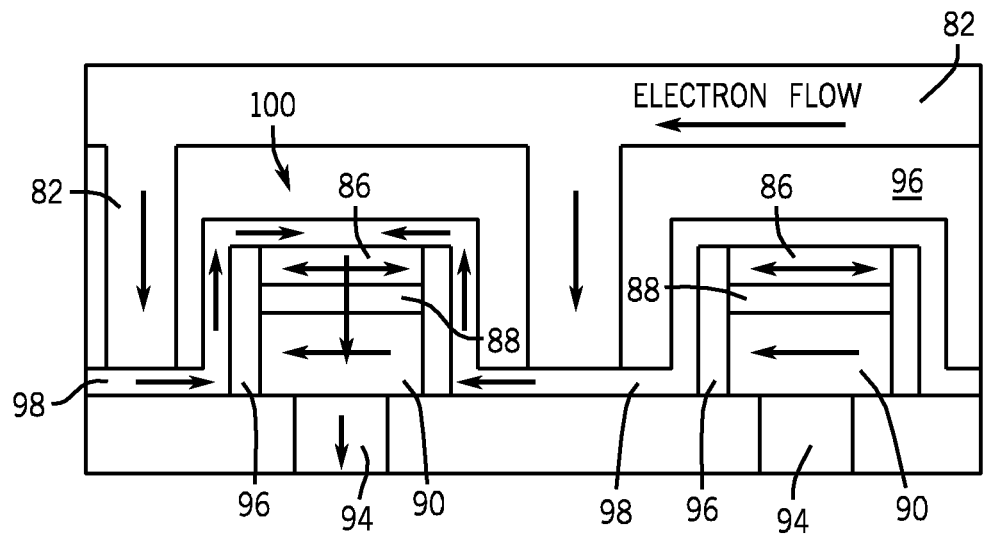
FIGS. 4-6 depict axial views of different embodiments of STT-MRAM cells configured for heat-assisted programming, in accordance with embodiments of the present technique.

The present techniques may involve different configurations of STT-MRAM structures. For example, FIG. 4 illustrates another embodiment of an STT-MRAM structure 100 which may be configured to be programmed with a reduced programming current by utilizing a transient heating effect. The STT-MRAM cell structure 100 of FIG. 4 includes a free region 86 and a pinned region 90 with a nonmagnetic region 88 in between. The pinned region 90 may be coupled to a substrate contact 94 of the STT-MRAM array. In different embodiments, the pinned region 90 may either be in direct contact with the substrate contact 94, or may be insulated from the substrate contact 94 by insulative materials. The STT-MRAM structure 100 may include heater material 98 which may transfer a programming current from a data line 82 to the free region 86. The heater material 98 may increase the temperature of the free region 86 to decrease the magnetization of the free region 86 and facilitate in switching the magnetization of the free region 86 with the programming current. In some embodiments, the heater material 98 may be coupled to a heat insulator 96, which may limit temperature changes in the regions of the cell 100 due to the heat generated in the heater material 98.

As depicted in FIG. 4, the heater material 98 may be disposed over one or more STT-MRAM structures, and may also be connected to the data lines 82 which deliver current to each cell. When a memory cell is selected to be programmed, the programming current may travel through the data line(s) 82 corresponding to the selected cell, and through the heater material 98 in contact with the data line(s) 82 of the selected cell. The flow of the programming current through the heater material 98 may cause the heater material 98 to generate a transient heat, which may increase the temperature of the free region 86. The transient temperature increase in the free region 86 may decrease the magnetization, and thus the critical switching current density of the free region 86. The magnetization of the free region 86 may be switched according to the polarity of the programming current, and the programming current may then pass through the nonmagnetic region 88 and the pinned region 90 to the substrate contact 94. Thus, the same programming current that is directed to the heater material 98 to increase the temperature of the free region 86 also switches the magnetization based on the spin polarity of the current. Further, because of the decrease in the critical switching current density, a lower programming current may be sufficient for switching the magnetization of the free region 86 to program the cell.

In some embodiments, the STT-MRAM cell structure 100 may also include a heat insulator 96, such as silicon dioxide, to protect the thermal profile of the STT-MRAM structure by insulating the magnetic materials of the structure 100. For example, the heat insulator 96 may be disposed between the heater material 98 and the regions of the structure 100. In some embodiments, the heat insulator 96 may also be disposed between the free region 86 and the heater material 98 to control and/or slow the heating of the free region 86.

Figure 5:
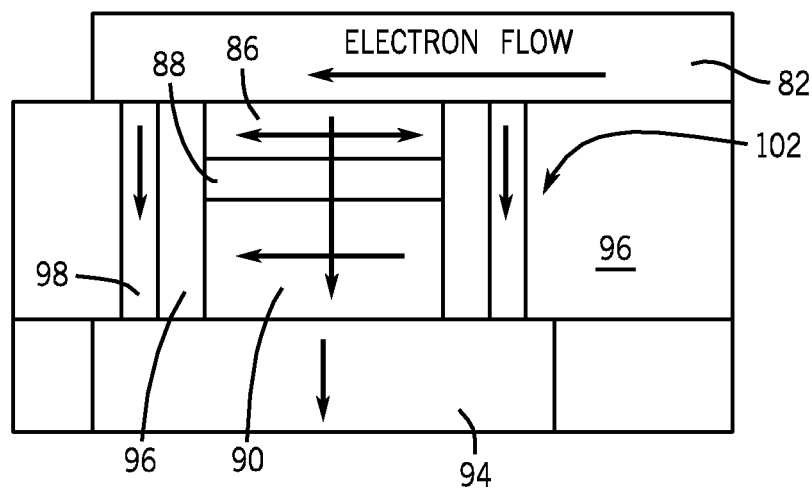

Another embodiment of the present techniques is presented in FIG. 5, which illustrates an STT-MRAM cell structure 102 having heater material 98 disposed perpendicularly to the memory cell regions. The structure 102 may include a free region 86 and a pinned region 90 with a nonmagnetic region 88 in between the free and pinned regions 86 and 90. The cell may be accessed through a data line 82, which may deliver a programming current through the regions (e.g., the free, nonmagnetic, and pinned regions 86, 88, and 90) of the structure 102 to a substrate contact 94. Each structure 102 may also include heater material 98, which also provides a current path between the data line 82 and the substrate contact 94 of the cell structure 102.

In some embodiments, the structure 102 may also include heat insulators 96, which may insulate portions of the cell structure 102 from the heating material 98. For example, the heat insulators 96 may be configured perpendicularly between the regions of the cell structure 102 and the heating material 98 to control the temperature of the cell and/or facilitate in maintaining cell integrity. In one embodiment, the heating material 98 may be in direct contact with the data line 82 and the free region 86, and in some embodiments, the cell structure may include buffer nonmagnetic materials, such as Cu, Au, Ta, TaN, TiN Ru, Ag, CuPt, CuMn, other nonmagnetic transition metals, such as Os, Ru, Re, alloys comprising at least two elements of Os, Ru and Re, or any combination of the above nonmagnetic conductive materials. The buffer nonmagnetic materials may be disposed between the free region 86 and the heating material 98, and may eliminate direct contact between the two materials to control the temperature changes in the cell structure and/or protect the integrity of the cell.

Figure 6:
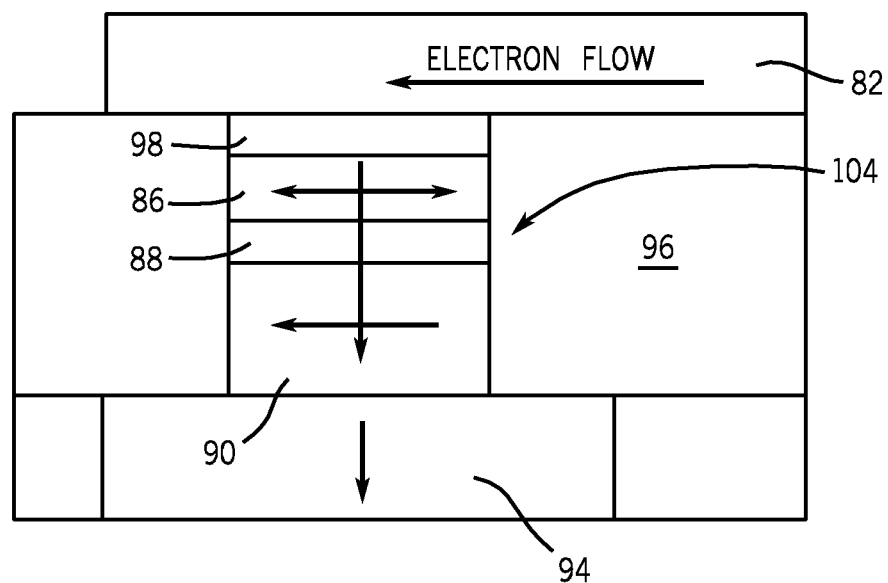

In another embodiment, an STT-MRAM cell structure 104, as illustrated in FIG. 6, may include heating material 98 disposed between a data line 82 and the regions of the cell structure 104. The structure may include heating material 98, a free region 86, a nonmagnetic region 88, and a pinned region 90 over a substrate contact 94 of the cell. The programming current in the heating material 98 may cause the heating material 98 to generate heat, which increases the temperature of the free region 86. The increase in temperature in the free region 86 may result in a decrease in magnetization, and a proportionate decrease in the critical switching current density, or the current density in the free region 86 at which the magnetic materials of the region may be switched in magnetization. Thus, the heating material 98 may facilitate in delivering the programming current from the data line 82 to the free region 86, as well as in reducing the critical switching current density, such that a lower programming current may program the selected cell.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of operating a memory cell comprising:
heating a free region of a magnetic cell structure to increase the temperature of the free region, wherein heating the free region comprises decreasing a critical switching current density of the free region; and
programming the memory cell while the temperature of the free region is increased.

2. The method, as set forth in claim 1, wherein heating the free region comprises transferring heat from a heater material to the free region.

3. The method, as set forth in claim 2, wherein transferring heat from the heater material to the free region is facilitated by an electrical insulator.

4. The method, as set forth in claim 1, wherein decreasing the critical switching current density of the free region comprises decreasing the critical switching current density of the free region to approximately 0.5 mA/cm$^2$.

5. The method, as set forth in claim 1, wherein heating the free region comprises directing a current to the free region.

6. The method, as set forth in claim 5, wherein the current is directed in a current path, wherein the current path flows from a pinned region in the magnetic cell structure to the free region to the heater material.

7. The method, as set forth in claim 5, wherein the current is directed in a current path, wherein the current path flows from the heater material to the free region.

8. The method, as set forth in claim 7, wherein a portion of the current path through the heater material is in a direction perpendicular to the free region and a pinned region in the magnetic cell structure.

9. The method, as set forth in claim 5, wherein the current is directed in one or more parallel current paths, wherein a first current path is through the heater material, and wherein a second current path is through the free region and a pinned region of the magnetic cell structure.

10. A magnetic cell structure comprising:
   a free region;
   a pinned region; and
   a heater material configured to generate heat and transfer the heat to the free region when a programming current is directed to the magnetic cell structure, wherein a first orientation of the free region is crosswise to a second orientation of the heater material.

11. The magnetic cell structure, as set forth in claim 10, comprising an electrical insulator to facilitate heat transfer from the heater material to the free region.

12. The magnetic cell structure, as set forth in claim 10, wherein the free region and the pinned region comprise ferromagnetic materials.

13. The magnetic cell structure, as set forth in claim 10, comprising a nonmagnetic region disposed between the free region and the pinned region.

14. The magnetic cell structure, as set forth in claim 10, comprising an insulative region configured to insulate one or more regions of the magnetic cell structure from one or more of the programming current and the heat generated in the heater material.

15. The magnetic cell structure, as set forth in claim 10, comprising an electrode coupled to the free region and the heater material, wherein the electrode is configured to carry the programming current to one or more regions of the magnetic cell structure.

16. The magnetic cell structure, as set forth in claim 10, wherein the heater material comprises TiN, ZrN, HfN, VN, NbN, TaN, TiAlN, TiSiN, TaSiN, TiCN, TiC, ZrC, HfC, VC, NbC, TaC, Cr3C2, Mo2C, WC, SiC, B4C, TiB2, ZrB2, HfB2, VB2, NbB2, TaB2, CrB2, Mo2B5, W2B5, WSix, MoSi2, $SnO_2$:Sb, carbon, niobium, tungsten, molybdenum, metal alloys, or any combination thereof.

17. The magnetic cell structure, as set forth in claim 16, arranged such that during operation, the programming current is directed to the magnetic cell structure in parallel, wherein one path of the programming current is directed to the free region and the pinned region, and wherein another path of the programming current is directed to the perpendicularly arranged heater material.

18. The magnetic cell structure, as set forth in claim 16, configured to provide a current path from the pinned region to the free region to a conductive region to the heater material.

19. The magnetic cell structure, as set forth in claim 10, configured to provide a current path from the heater material to the free region to the pinned region.

20. The magnetic cell structure, as set forth in claim 10, wherein a spin-torque transfer magnetic random access memory cell comprises the magnetic cell structure.

21. A method of operating a memory cell comprising:
   decreasing a critical switching current density of a free region of a magnetic cell structure; and
   programming the memory cell after decreasing the critical switching current density of a free region of a magnetic cell structure.

22. The method, as set forth in claim 21, wherein decreasing the critical switching current comprises heating the free region.

23. The method, as set forth in claim 22, wherein heating the free region comprises transferring heat from a heater material to the free region.

24. The method, as set forth in claim 23, wherein transferring heat from the heater material to the free region is facilitated by an electrical insulator.

25. The method, as set forth in claim 21, wherein decreasing the critical switching current density of the free region comprises decreasing the critical switching current density of the free region to approximately 0.5 mA/cm$^2$.

* * * * *